United States Patent
Lee et al.

(10) Patent No.: US 7,594,969 B2
(45) Date of Patent: Sep. 29, 2009

(54) DEVICE FOR CONTROLLING DISPENSING ERROR IN PHOTO SPINNER EQUIPMENT

(75) Inventors: Jong-Hwa Lee, Hwaseong-si (KR); Chan-Hoon Park, Seoul (KR); Ki-Hyun Chyun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 481 days.

(21) Appl. No.: 11/454,843

(22) Filed: Jun. 19, 2006

(65) Prior Publication Data

US 2007/0017635 A1    Jan. 25, 2007

(30) Foreign Application Priority Data

Jul. 19, 2005    (KR)    ...... 10-2005-0065141

(51) Int. Cl.
- B05C 11/00    (2006.01)
- B05C 11/02    (2006.01)
- B05B 7/06    (2006.01)

(52) U.S. Cl. .......... 118/692; 118/52; 118/612; 118/313; 118/315; 134/198; 134/902

(58) Field of Classification Search ............ 118/52, 118/612, 300, 692, 712, 713, 313–315, 602, 118/302; 427/240, 8, 9, 427.1; 396/604, 396/611, 627; 134/153, 198, 902
See application file for complete search history.

(56) References Cited

U.S. PATENT DOCUMENTS

| | | | |
|---|---|---|---|
| 6,190,063 B1 * | 2/2001 | Akimoto | ............ 396/611 |
| 6,322,009 B1 | 11/2001 | Subramanian et al. | |
| 6,384,894 B2 | 5/2002 | Matsuyana et al. | |
| 6,688,784 B1 | 2/2004 | Templeton | |
| 2003/0180471 A1 * | 9/2003 | Takekuma et al. | ........ 427/421 |
| 2006/0141130 A1 * | 6/2006 | Kwon et al. | ............ 427/58 |

* cited by examiner

*Primary Examiner*—Yewebdar T Tadesse
(74) *Attorney, Agent, or Firm*—Volentine & Whitt, PLLC

(57) ABSTRACT

A chemical solution dispensing device adapted for use with photo spinner equipment is disclosed. The device includes a nozzle adapted to spray chemical solution onto a wafer, a pressure sensor associated with the nozzle and adapted to sense a spraying pressure and generate a pressure value corresponding to the sensed spraying pressure, and a controller adapted to receive the pressure value, compare the received pressure value to a predetermined threshold pressure value, and generate an interlock signal when the received pressure value exceeds the predetermined threshold pressure value.

4 Claims, 2 Drawing Sheets

DEVICE FOR CONTROLLING DISPENSING ERROR IN PHOTO SPINNER EQUIPMENT

BACKGROUND OF THE INVENTION

1. Technical Field

Embodiments of the invention relate to a control device adapted for use in spinner equipment. More particularity, embodiments of the invention relate to a control device adapted to reduced error (e.g., blockage) in the dispensing of a chemical solution through a nozzle.

This application claims priority under 35 U.S.C. §119 to Korean Patent Application 10-2005-0065141, filed on Jul. 19, 2005, the subject matter of which is hereby incorporated by reference in its entirety.

2. Description of Related Art

The multitude of processes used in the manufacture of a semiconductor device may be generally classified as being related to fabrication, assembly, and test. Fabrication processes, such as impurity diffusion, photoresist formation, material layer etching, and material layer formation, are sequentially performed on the surface of a substrate, such as a wafer, to fabricate an electrical circuit. Fabrication processes are usually complete when the electrical circuit (usually contained in a section of wafer called a die) is fully operable in its "on-wafer" state.

Photolithography processes are a common type of fabrication process. In a typical photolithography process an oxide layer is formed to protect the surface of polished silicon wafer. A photo-etching process is then performed in which a liquid chemical solution is "spun-on" the wafer by dropped the solution onto the oxide layer and then rotating the wafer at high speed to uniformly coat the wafer. After drying the spin coated layer, the wafer is irradiated with optical energy (hereafter "light") through a patterned mask. The portion of light passing through the mask reacts with (e.g., oxidizes) the chemical solution layer. Then, wafer is developed such that the oxidized surface portions on the wafer react to form a virtual circuit pattern image. Subsequently, material layers previously formed on the wafer (i.e., under the chemical solution layer) may be selectively removed by various etching processes that use gas and/or other chemical solutions. In this manner, a desired circuit pattern may be formed on the wafer. As one might expect, the provision of the chemical solution onto the wafer is a very important factor in the ultimate quality of the resulting circuit pattern. For example, the thickness of the chemical solution layer covering the wafer is critical to the precision determination of certain critical dimensions (CD) associated with the circuit pattern.

In a conventional application device adapted to coat a wafer with chemical solution (e.g. a photoresist solution), a sensor is routinely installed at a front end of an exchange valve associated with a storage tank to prevent the undesirable generation of air bubbles within the photoresist solution. This sensor is often backed-up by an auxiliary sensor connected between the exchange valve associated with the storage tank and a chemical solution supply tube. In this manner a well controlled flow of photoresist solution may be maintained.

For example, one device adapted to uniformly coat a wafer with photoresist solution is disclosed in U.S. Pat. No. 6,332,924 B1, the subject matter of which is hereby incorporated by reference. This device allows a wafer to be uniformly coated with a chemical solution under uniform discharge pressure provided through a nozzle.

FIG. 1 illustrates an exemplary configuration of a conventional chemical solution dispensing device.

The chemical solution dispensing device includes at least two bottles 12a and 12b containing chemical solution; a chemical supply line 14 forming a flow path for the chemical solution between bottles 12a and 12b; a spin chuck 42 connected to motor 40; and a purge gas supply tube 16 supplying purge gas under pressure to bottles 12a and 12b from a purge gas supply source 11. The chemical solution dispensing device also includes a trap tank 18 extending from each one of bottles 12a and 12b adapted to provide a defined amount of chemical solution to chemical supply line 14, and first and second valves 15 and 17 adapted to control the flow of chemical solution passing through trap tank 18 in response to a control signal received from controller 20. The chemical solution dispensing device also includes a photosensor 24a/24b constructed from a light emitter and a light receiver and adapted to check whether trap tank 18 is filled with chemical solution. A control signal sensed by photosensor 24a/24b received from controller 20 controls the process.

Further, the chemical solution dispensing device includes a pump 19 adapted to provide flow pressure to the chemical solution flowing through chemical supply line 14; a chemical filter 30 adapted to filter foreign matter and air bubbles from the chemical solution flowing though chemical supply line 14; a suck back valve 26 connected behind chemical filter 30 and adapted to provide suction to chemical supply line 14, such that residual drops of sprayed chemical solution do not drop onto a wafer (W) once a spraying operation is completed; and a nozzle 28 connected to suck back valve 26 and adapted to spray the chemical solution. The chemical solution dispensing device also includes a bubble exhaust line 32 and exhaust valve 34 connected to chemical filter 30 and adapted to remove air bubbles from the interior of chemical filter 30.

When a first valve 15 or second valve 17 is opened by controller 20 to coat wafer (W) with chemical solution, the chemical solution flows into pump 19 from bottles 12a and/or 12b. Pump 19 pressurizes the inflowing chemical solution under the control of controller 20, and transfers it to chemical filter 30. Chemical filter 30 filters the pressurized chemical solution. The filtered chemical solution is then sprayed through nozzle 28 under pressure provided by pump 19. Nozzle 28 typically has numerous spraying holes 29 formed at uniform intervals to uniformly spray the chemical solution onto the wafer (W).

When this type of conventional chemical solution dispensing device is used for long durations with photoresist spinner equipment, for example, small blockages may form in some of spraying holes 29 thereby impeding the uniform spraying of chemical solution onto the wafer W. This effect causes defects in quality of the products (e.g., semiconductor devices) ultimately formed on wafer (W).

SUMMARY OF THE INVENTION

Embodiments of the invention provide a device reducing errors associated with the dispensing of a chemical solution in photo spinner equipment. In these embodiments, nozzle blockages are inhibited and deterioration otherwise occurring in fabricated products is avoided.

In one embodiment, the invention provides a chemical solution dispensing device adapted for use with photo spinner equipment and comprising; a nozzle adapted to spray chemical solution onto a wafer, a pressure sensor associated with the nozzle and adapted to sense a spraying pressure and generate a pressure value corresponding to the sensed spraying pressure, and a controller adapted to receive the pressure value, compare the received pressure value to a predetermined threshold pressure value, and generate an interlock signal when the received pressure value exceeds the predetermined threshold pressure value.

In one related aspect, the nozzle may comprise numerous spraying holes adapted to spray chemical solution. In another related aspect, the predetermined threshold pressure value may be about 0.1 MPA. In another related aspect, the pressure sensor may be installed on a face of the nozzle.

DESCRIPTION OF EMBODIMENTS

An embodiment of the invention will now be described in some additional detail with reference to FIG. 2. It will be understood by those skilled in the art that the present invention may be variously embodied and is not limited to only the illustrated embodiments. Rather, this embodiment is presented as a teaching example.

Figure 1:
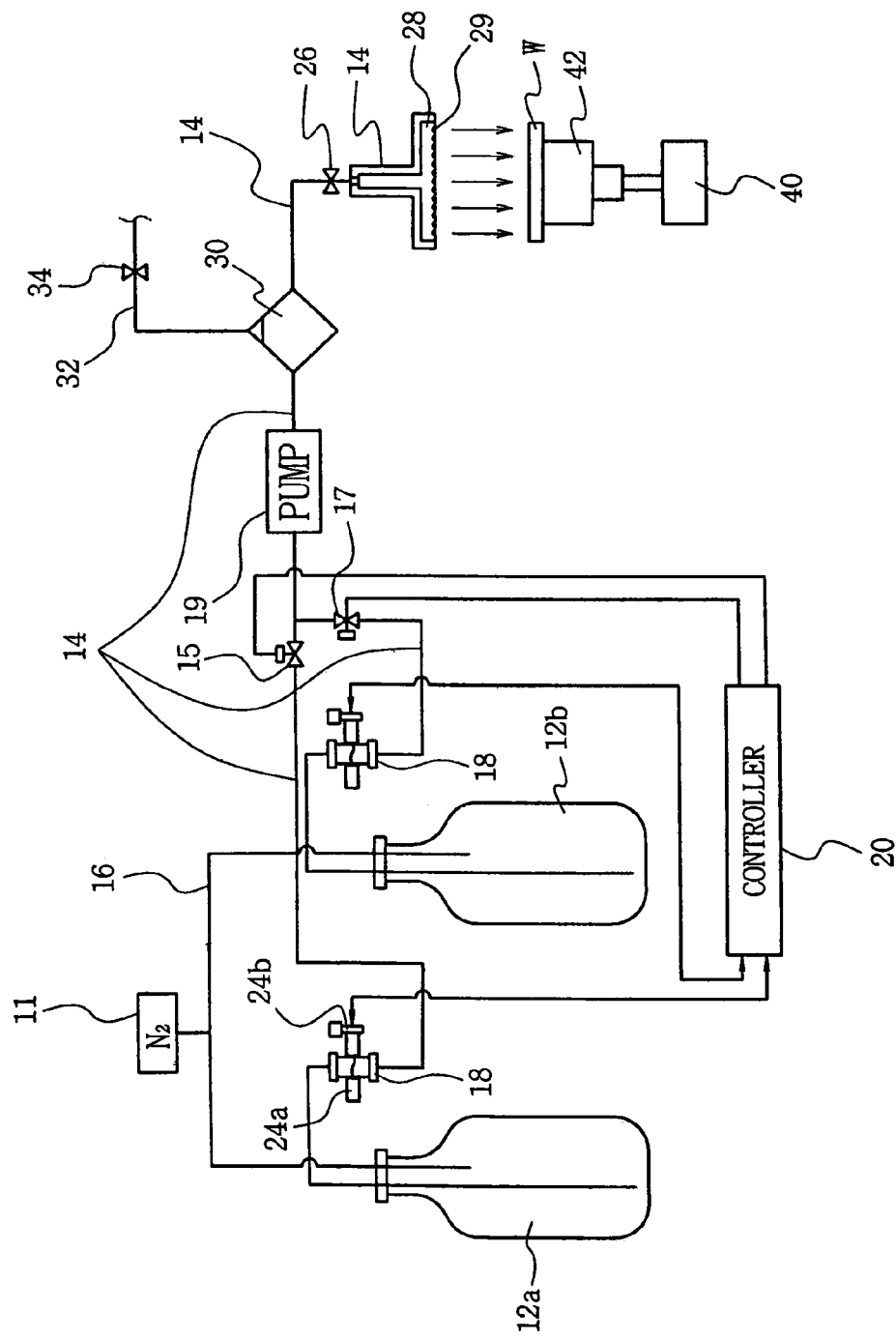
FIG. 1 illustrates one configuration of a conventional chemical solution dispensing device.
Figure 2:
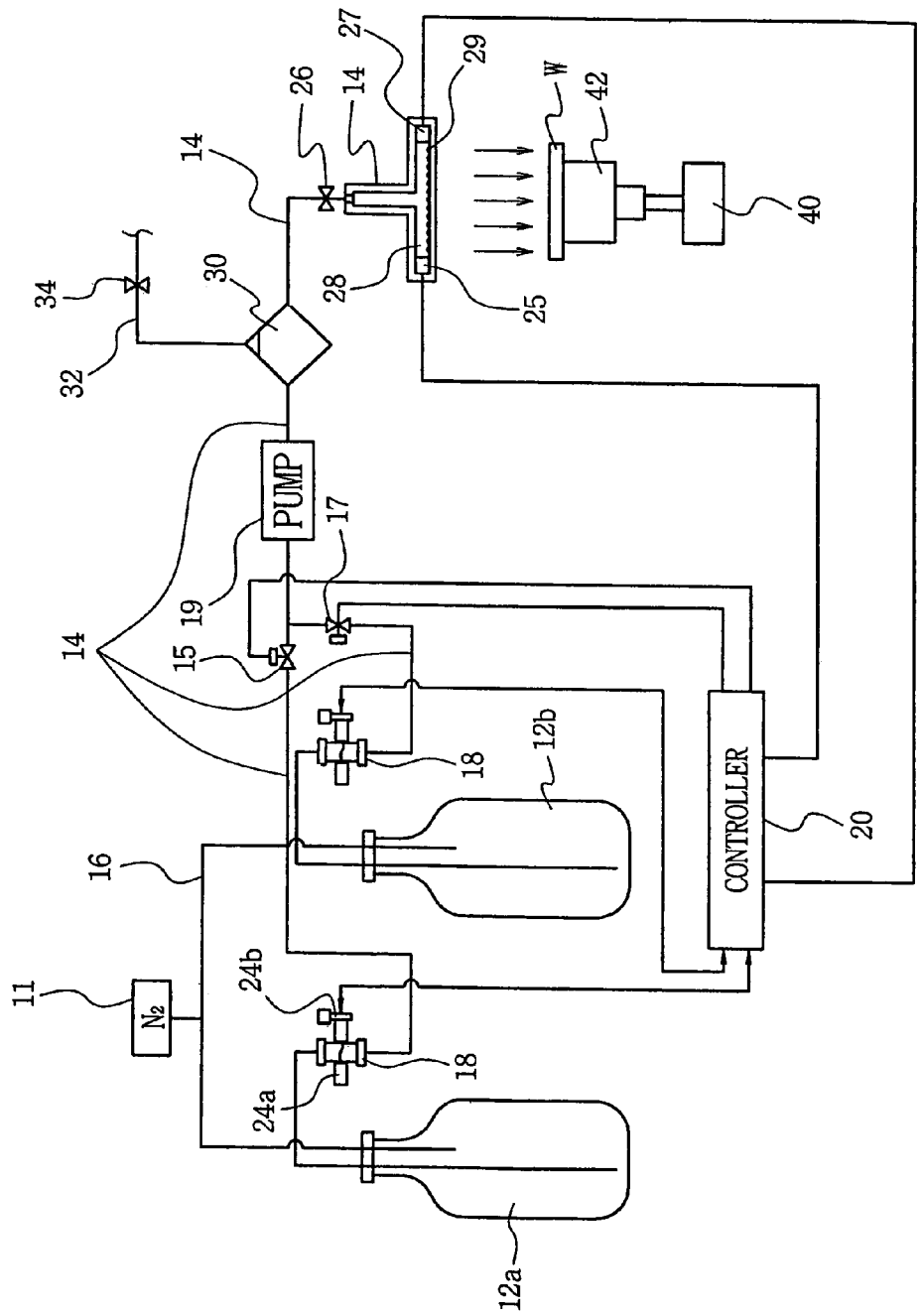
FIG. 2 illustrates one exemplary configuration of chemical solution dispensing device according to an embodiment of the invention.

FIG. 2 illustrates an exemplary configuration of chemical solution dispensing device according to an embodiment of the invention.

As before, the chemical solution dispensing device comprises at least two bottles 12a and 12b containing chemical solution; a chemical supply line 14 forming a flow path for the chemical solution between bottles 12a and 12b; a spin chuck 42 connected to motor 40; and a purge gas supply tube 16 supplying purge gas under pressure to bottles 12a and 12b from a purge gas supply source 11. The chemical solution dispensing device also comprises a trap tank 18 extending from each one of bottles 12a and 12b adapted to provide a defined amount of chemical solution to chemical supply line 14, and first and second valves 15 and 17 adapted to control the flow of chemical solution passing through trap tank 18 in response to a control signal received from controller 20. The chemical solution dispensing device also comprises a photosensor 24a/24b constructed from a light emitter and a light receiver and adapted to check whether trap tank 18 is filled with chemical solution. A control signal sensed by photosensor 24a/24b received from controller 20 controls the process.

Further, the chemical solution dispensing device comprises a pump 19 adapted to provide flow pressure to the chemical solution flowing through chemical supply line 14; a chemical filter 30 adapted to filter foreign matter and air bubbles from the chemical solution flowing though chemical supply line 14; a suck back valve 26 connected behind chemical filter 30 and adapted to provide suction to chemical supply line 14, such that residual drops of sprayed chemical solution do not drop onto a wafer (W) once a spraying operation is completed; and a nozzle 28 connected to suck back valve 26 and adapted to spray the chemical solution. The chemical solution dispensing device also comprises a bubble exhaust line 32 and exhaust valve 34 connected to chemical filter 30 and adapted to remove air bubbles from the interior of chemical filter 30.

When a first valve 15 or second valve 17 is opened by controller 20 to coat wafer (W) with chemical solution, the chemical solution flows into pump 19 from bottles 12a and/or 12b. Pump 19 pressurizes the inflowing chemical solution under the control of controller 20, and transfers it to chemical filter 30. Chemical filter 30 filters the pressurized chemical solution. The filtered chemical solution is then sprayed through nozzle 28 under pressure provided by pump 19. Nozzle 28 has numerous spraying holes 29 formed at uniform intervals to uniformly spray the chemical solution onto the wafer (W).

However, nozzle 28 is also configured with first and second pressure sensors 25 and 27 respectively installed on opposite ends of nozzle 28 and adapted to sense spraying pressure. Controller 20 is further adapted to receive pressure values obtained from first and second pressure sensors 25 and 27. The received pressure values are compared with predetermined threshold pressure values associated with un-blocked operation of nozzle 28. In this manner, controller 20 may determine whether nozzle 28 has become blocked and generate an interlock signal when such a determination is made.

Thus, as a chemical solution is sprayed on the wafer (W) mounted on spin chuck 42, first and second pressure sensors 25 and 27 continuously or periodically sense pressure applied by nozzle 28. Pressure values sensed by first and second pressure sensors 25 and 27 are applied to controller 20, and controller 20 checks whether the received pressure values exceed a predetermined threshold pressure value, (e.g., 0.1 MPA value). When the sensed pressure exceeds the threshold pressure, controller 20 generates an interlock signal to stop the process.

In the illustrated embodiment, so long as spraying holes 29 of nozzle 28 remain unblocked, the resulting spraying pressure stays below the threshold pressure (e.g., about 0.1 MPA). However, as too many of the spraying holes 29 become blocked, the spraying pressure rises above the threshold pressure to trip the interlock signal.

As described above, according to an exemplary embodiment of the invention, a spraying pressure of nozzle is checked when dispensing chemical solution onto a wafer in photo spinner equipment. When too many spraying holes become blocked, an interlock signal is generated and the process is stopped. Thus, quality deterioration in the products being fabricated does not occur.

It will be apparent to those skilled in the art that modifications and variations can be made to the foregoing without deviating from the scope of the invention as defined by the following claims.

What is claimed is:

1. A chemical solution dispensing device for use with photo spinner equipment and comprising:
    a nozzle configured to spray chemical solution onto a wafer, the nozzle comprising a plurality of spraying holes formed through a common face opposing the wafer and configured to discharge the chemical solution;
    a pressure sensor disposed on the common face of the nozzle adjacent to the plurality of spraying holes to sense a spraying pressure for the chemical solution discharged from the plurality of spraying holes, and generate a pressure value corresponding to the sensed spraying pressure; and
    a controller configured to receive the pressure value, compare the received pressure value to a predetermined threshold pressure value, and generate an interlock signal when the received pressure value exceeds the predetermined threshold pressure value.

2. The device of claim 1, wherein the predetermined threshold pressure value is about 0.1 MPA.

3. A chemical solution dispensing device for use with photo spinner equipment and comprising:
    a nozzle configured to spray chemical solution onto a wafer, the nozzle comprising a plurality of spraying holes formed through a common face opposing the wafer and configured to discharge the chemical solution;

first and second pressure sensors and disposed at opposite lateral ends of the common face of the nozzle respectively adjacent to the plurality of spraying holes, each one of the first and second pressure sensors configured to respectively sense a spraying pressure for the chemical solution discharged from the plurality of spraying holes, and generate a pressure value corresponding to the sensed spraying pressure; and a controller configured to receive pressure values from the first and second pressure sensors, compare the received pressure values to a predetermined threshold pressure value, and generate an interlock signal when one of the received pressure values exceeds the predetermined threshold pressure value.

4. The device of claim 1, wherein the predetermined threshold pressure value is about 0.1 MPA.

* * * * *